United States Patent [19]

Luryi et al.

[11] Patent Number: 5,012,486
[45] Date of Patent: Apr. 30, 1991

[54] VERTICAL CAVITY SEMICONDUCTOR LASER WITH LATTICE-MISMATCHED MIRROR STACK

[75] Inventors: Sergey Luryi, Bridgewater; Ya-Hong Xie, Flemington, both of N.J.

[73] Assignee: AT&T Bell Laboratories, Murray Hill, N.J.

[21] Appl. No.: 506,413

[22] Filed: Apr. 6, 1990

[51] Int. Cl.[5] ............................................. H01S 3/19
[52] U.S. Cl. .......................................... 372/45; 372/99
[58] Field of Search ...................... 372/45, 43; 11/99

[56] References Cited

U.S. PATENT DOCUMENTS

| 4,943,970 | 7/1990 | Bradley | 372/45 |
| 4,949,351 | 8/1990 | Imanaka | 372/45 |

FOREIGN PATENT DOCUMENTS

| 0081887 | 5/1985 | Japan | 372/45 |
| 0081888 | 5/1985 | Japan | 372/45 |
| 0094689 | 4/1989 | Japan | 372/45 |

Primary Examiner—Georgia Epps
Attorney, Agent, or Firm—D. I. Caplan

[57] ABSTRACT

In a vertical semiconductor laser, the top mirror is composed of alternating layers of lattice-mismatched semiconductors. Quantum reflections and other charge transport barriers for majority carriers at the interface, and hence electrical resistance and power dissipation, are reduced by choosing the lattice-mismatched semiconductor materials in such a manner as to align their band edges for majority carriers. On the other hand, the semiconductor materials are selected to supply relatively large refractive index differences, and hence relatively large optical reflections, at their interfaces. The lattice-mismatching may also produce vertical thread dislocations through the stack, which increase the electrical conductivity.

18 Claims, 1 Drawing Sheet

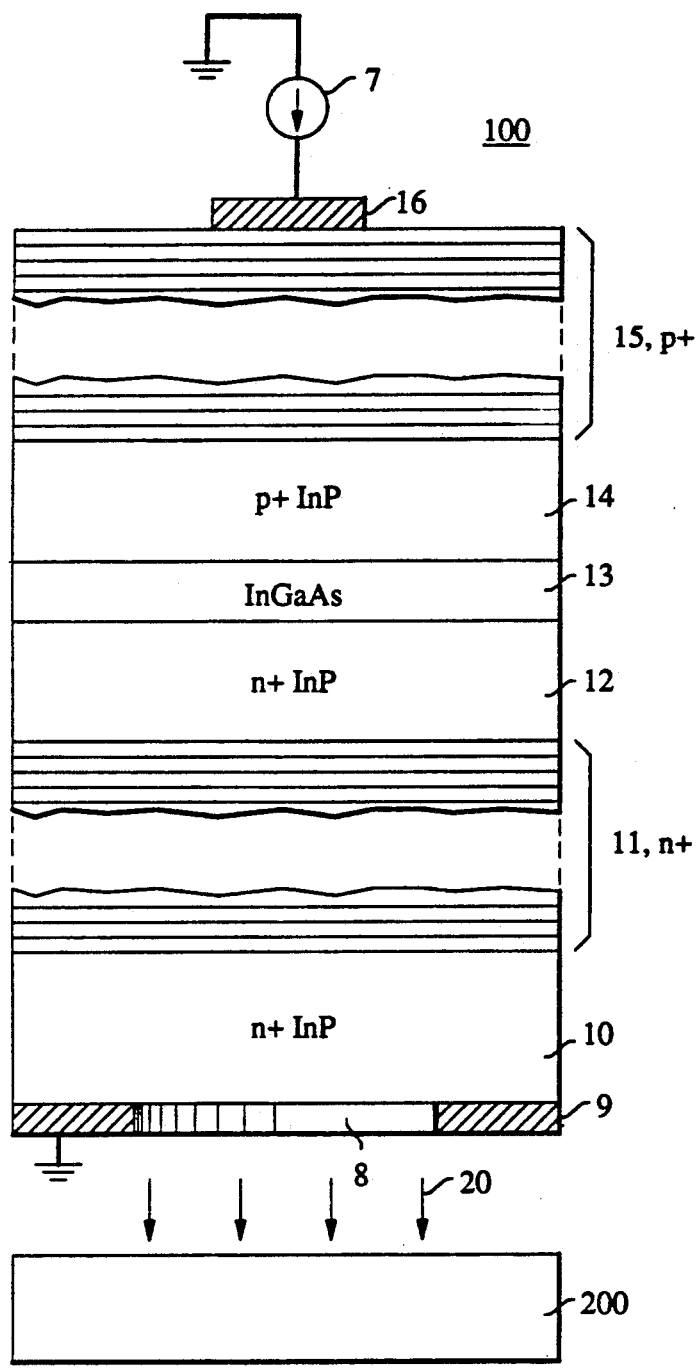

VERTICAL CAVITY SEMICONDUCTOR LASER WITH LATTICE-MISMATCHED MIRROR STACK

TECHNICAL FIELD

This invention relates to optical systems comprising semiconductor lasers and more particularly to those systems comprising lasers which have vertical cavities for the emission of light (optical radiation) through a major ("horizontal") surface of the semiconductor.

BACKGROUND OF THE INVENTION

In optical systems of prior art, the structure of one useful form of semiconductor lasers is a vertical cavity (or simply "vertical") laser. In a vertical laser, there is an active region in a semiconductor body (substrate) which includes a planar pn junction. Typically the plane of this pn junction is parallel to a major surface of a semiconductor substrate body, the major surface of the substrate being considered arbitrarily to be horizontal. In a vertical laser, light is emitted from the top or the bottom (major) surface, or both, of the semiconductor body, a vertical optical cavity being created therein by virtue of reflecting optical mirror(s) located on the top or bottom surface thereof, or both.

The structure of a vertical laser can be made circularly symmetric. Therefore, a vertical laser can have the advantage of relatively low astigmatism. Also, because a vertical laser can be made with a relatively large aperture, it can have the further advantage of a low divergence of the emerging beam as compared with other laser, such as "edge" lasers in which light is emitted from a side edge of the semiconductor body.

A vertical laser typically is built as a double heterostructure (two junctions between chemically dissimilar materials), for example, by successive epitaxial growth of the following semiconductor layers in spatial sequence upon a semiconductor substrate: the bottom mirror, a bottom optical cladding region, the active region, a top cladding region, and the top mirror. Typically, in a vertical laser each mirror(s) is formed by a quarter-wavelength stack, such as a mirror stack formed by alternating layers of two semiconductor materials with differing chemical compositions and hence differing refractive indices, which thus form a semiconductor superlattice. The choice of the semiconductor materials for the mirror stack is made so as to result in large differences in these refractive indices, in order to maximize optical reflectivity and hence minimize the number of periods in the superlattice, and thus minimize undesirable vertical electrical resistance and unwanted power dissipation.

In an optically pumped semiconductor laser, optical radiation of wavelength(s) shorter than that (those) to be emitted by the laser is directed upon the laser to create an electronic population inversion. In a typical electrically pumped (driven) vertical cavity semiconductor laser, electrical current is passed between a top electrode formed on the top major surface of the top mirror and a bottom electrode formed on the bottom major surface of the semiconductor substrate. Many such vertical lasers can be built on a single such substrate, as by trench or other isolation, in such a way that the intensity of light—e.g., ON vs. OFF—emitted by each laser can be controlled by an electrical signal independently of all other lasers on the substrate. Thus, vertical lasers appear especially attractive for use in practical applications where more than one independently controllable source of light is desired on a single substrate. Alternatively, many separate lasers can be mass produced from the single substrate, as by masking and etching apart the individual lasers.

In prior art, the semiconductor substrates that have been used for double heterostructure vertical lasers have been mostly gallium arsenide or indium phosphide. It has been believed to be necessary to build such lasers with very nearly lattice matching of the double heterostructure, including the mirror(s), in order to achieve the high quality (low defect density) epitaxial growth needed for the desirably low optical absorption and high quantum efficiency of light emission. Consequently, the choice of materials for the mirror stack has been limited, in order at the same time to preserve the large difference in refractive index between contiguous layers in the stack. In turn, this limited choice of semiconductor materials usually results in undesirably large conduction and valence band edge discontinuities, whereby undesirably high electrical resistance is exhibited by the mirror stack, owing to the resulting high quantum reflection coefficients and other charge transport barriers ("effective barriers") for both electrons and holes at the interfaces of contiguous layers in the mirror stack. In turn, this high resistance results in undesirably high power loss (dissipation) in the laser.

It would therefore be desirable to have a vertical laser which mitigates the problem of high electrical resistance and power dissipation.

SUMMARY OF THE INVENTION

The top mirror of a semiconductor vertical laser structure is made of lattice-mismatched materials having band edge discontinuities that are relatively small—that is, less than about 50 meV, i.e., the equivalent of about 2 kT (k=Boltzmann's constant, T=room temperature)—for the majority carriers in the stack. To achieve this end, the lattice mismatch is typically in the range of about 0.20 or 0.30 percent to 3.0 percent or more. In this way, electrical resistance and power dissipation can be significantly reduced, and at the same time the structure can have suitably large refractive index differences between contiguous layers in the top mirror stack. At the same time also, the lattice defects (dislocation lines) caused by the lattice mismatch may supply useful vertical conduction paths for electrical current and thus may further reduce the electrical resistance.

BRIEF DESCRIPTION OF THE DRAWING(S)

This invention together with its features and characteristics may be better understood from the following detailed description when read in conjunction with the drawing in which the FIGURE is a side view in cross section of a semiconductor laser structure, together with means for utilizing its optical output, in accordance with a specific embodiment of the invention. Only for the sake of clarity, the FIGURE is not drawn to any scale.

DETAILED DESCRIPTION

As shown in the FIGURE, an optical system comprises a vertical laser structure 100, together with means 200 for utilizing optical output beam 20 emitted by the laser 100. Illustratively, the vertical laser structure 100 comprises an n+ type indium phosphide (InP) substrate body 10, a bottom n+ type mirror stack 11, a bottom n+ type InP cladding layer 12, a lattice-matched p type indium gallium arsenide ($In_xGa_{1-x}As$) active layer 13 (wavelength, $\lambda = 1.55$ μm), a top p+ type InP cladding layer 14, and a top p+ type mirror stack 15 (described in greater detail below). The structure also includes a bottom electrode 9 having an aperture 8 located on the body 10 and a top electrode 16 located on the top surface of the mirror stack 15. By "lattice-matched" InGaAs is meant $In_xGa_{1-x}As$ with $x = 0.53$. The top cladding layer 14, the active region 13, the bottom cladding layer 12, the bottom mirror stack 11, and the substrate 10 are mutually lattice matched. However, the top mirror stack is not lattice matched: it contains at least one layer which is not lattice matched, whereby the top mirror stack is threaded with desirable dislocations.

The bottom n+ type mirror stack 11 typically comprises about 20 periods or more of alternating quarter wavelength thick layers of n+ type InP and lattice-matched n+ type InGaAs (each period having one quarter wavelength thick layer of n+ type InP and one quarter wavelength thick layer of lattice-matched n+ type InGaAs).

The top mirror stack 15 illustratively comprises alternating quarter wavelength thick layers of p+ type InP and lattice-mismatched p+ type aluminum indium arsenide, to wit, $Al_yIn_{1-y}As$, with y approximately equal to 0.82. In this way, the discontinuities of valence band edges at interfaces of contiguous lattice-mismatched layers are less than about 2 kT, in order to reduce the effective barrier to majority carriers (holes) at the interfaces and hence to reduce electrical resistance otherwise increased by the band-edge discontinuities. The lattice mismatch in this case amounts to about 2.2 percent.

During laser operation, a current source 7 drives the laser structure 100, whereby the output beam 20 of optical radiation is emitted by the laser structure 100 and is incident upon utilization means 200, which may include such elements as an optical detector, an optical lens, an optical fiber, or a combination thereof.

In an illustrative example, the InP substrate 10 and the bottom lattice-matched mirror stack 11 are heavily doped with donor impurities, such as sulfur or tin, to a concentration of approximately $1E18/cm^3$—i.e., $1 \times 10^{18}$ per cubic centimeter. On the top surface of the optical cladding layer 12 is located the active region 13 having a thickness of about 0.5 μm. The doping level in the bottom cladding layer 12 is made suitable for that of a laser, typically approximately $1E18/cm^3$.

The top cladding layer 14 illustratively has a thickness and an impurity doping level suitable for a laser, for example, a doping level of about $5E18/cm^3$, and may be graded. The doping level in the $Al_yIn_{1-y}As$ layers in the top mirror stack 15 is illustratively about $5E18/cm^3$; that of the InP layers therein is also about $5E18/cm^3$. The top electrode 16 is made of a material, such as gold or silver, which acts as an ohmic contact, and also acts as a mirror to enhance the reflection by the top mirror stack 15, if need be. The bottom aperture 8 in the bottom mirror 9 enables exit of light from the laser 100.

Instead of lattice-matched InGaAs, the active layer 13 can be made of alternating ("multiple") quantum well layers of InP and lattice-matched InGaAs. In such a case the thickness of each of the quantum well InP layers is approximately 5 to 50 nm, and the thickness of each of the quantum well InGaAs layers is in the approximate range of 1 to 20 nm. Typically, there are from 1 to 20 spatial periods in such an active layer formed by multiple quantum well layers.

Fabrication of the layers 11, 12, 13, 14, and 15 can be accomplished by such known methods as metal organic vapor phase epitaxy (MOVPE), also known as metal organic chemical vapor deposition (MOCVD), or by molecular beam epitaxy (MBE), or by hydride vapor phase epitaxy (HVPE). If needed, added annealing may be used to reduce the band edge discontinuity in the top mirror stack 15 further. The ohmic contact layer 9 can be fabricated by such known techniques as evaporation followed by photolithography to achieve a desirable annular shape, for example. The metal mirror contact 16 can be fabricated by such known techniques as evaporation of the mirror metal, followed by masking and lift-off or etching as known in the art.

It should be understood that many lasers can be fabricated on a single substrate by first forming all the semiconductor and metal layers all the way across the surfaces of the InP body 10, then forming by etching the individual metal mirror contacts 16 (one for each laser), thereafter etching the apertures 8 in the ohmic contacts 9, and then further masking and etching (or cleaving) apart the individual lasers. Alternatively, many lasers can remain integrated in an array on the same body 10 and at the same time can be mutually isolated by trench or mesa isolation techniques, as known in the art.

Although the invention has been described in detail with reference to a specific embodiment, various modifications can be made without departing from the scope of the invention. For example, in order to increase the energy (decrease the wavelength) per photon of the emitted light, the active region can contain phosphorus in an amount to form lattice-matched quaternary InGaAsP. As a further option, the active layer 13 could be GaAs in combination with a top mirror composed of alternating layers of AlAs and $In_zGa_{1-z}P$ with z approximately equal to 0.55, corresponding to a lattice mismatch of about 0.36 percent.

We claim:

1. A semiconductor laser structure comprising an active semiconductor layer upon which a cladding layer and a mirror stack have been grown, the mirror stack comprising a plurality of semiconductor layers at least one of which is lattice-mismatched with respect to another contiguous thereto.

2. A laser structure in accordance with claim 1 in which every other layer in the mirror stack has a same first lattice constant and all the remaining layers in the stack have a same second lattice constant different from the first.

3. The laser structure of claim 2 in which the difference between the first and second lattice constants amounts to at least 0.30 percent.

4. The laser structure of claim 2 in which the difference between the first and second lattice constants amounts to at least about 0.20 percent.

5. The laser structure of claim 1 in which the lattice mismatch amounts to at least 0.30 percent.

6. The laser structure of claim 1 in which the lattice mismatch amounts to at least 0.20 percent.

7. The laser structure of claim 1 in which the active layer is essentially GaAs and in which the mirror-stack comprises a plurality of alternating layers of essentially AlAs and $In_zGa_{1-z}P$, where z is approximately equal to 0.55.

8. The laser structure of claim 1 further including an electrode attached to the mirror stack, and in which the active layer is essentially InGaAs which generates light having a vacuum wavelength of about 1.55 μm in response to electrical current supplied to the electrode, and in which the mirror-stack comprises a plurality of alternating layers of essentially InP and $Al_yIn_{1-y}As$, where y is approximately equal to 0.82.

9. The structure of claim 8 in which y is approximately equal to 0.8.

10. An optical system including the structure of claim 1 and means for utilizing optical radiation which can be emitted by the structure.

11. An optical system including the structure of claim 2 and means for utilizing optical radiation emitted by the structure.

12. An optical system including the structure of claim 3 and means for utilizing optical radiation emitted by the structure.

13. An optical system including the structure of claim 4 and means for utilizing optical radiation emitted by the structure.

14. An optical system including the structure of claim 5 and means for utilizing optical radiation emitted by the structure.

15. An optical system including the structure of claim 6 and means for utilizing optical radiation emitted by the structure.

16. An optical system including the structure of claim 7 and means for utilizing optical radiation emitted by the structure.

17. An optical system including the structure of claim 8 and means for utilizing optical radiation emitted by the structure.

18. An optical system including the structure of claim 9 and means for utilizing optical radiation emitted by the structure.

* * * * *